(12) United States Patent
Cok

(10) Patent No.: US 7,459,850 B2
(45) Date of Patent: Dec. 2, 2008

(54) OLED DEVICE HAVING SPACERS

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 382 days.

(21) Appl. No.: 11/158,595

(22) Filed: Jun. 22, 2005

(65) Prior Publication Data
US 2006/0290271 A1 Dec. 28, 2006

(51) Int. Cl.
H01J 1/62 (2006.01)
H01J 1/88 (2006.01)

(52) U.S. Cl. ............... 313/512; 313/292; 313/238; 313/504

(58) Field of Classification Search ......... 313/495–512, 313/292, 238; 315/169.3, 169.4; 257/40, 257/79; 345/30, 36, 44, 45
See application file for complete search history.

(56) References Cited

U.S. PATENT DOCUMENTS

| 4,476,292 | A |   | 10/1984 | Ham et al. |         |
|-----------|---|---|---------|------------|---------|
| 4,769,292 | A |   | 9/1988  | Tang et al.|         |
| 5,247,190 | A |   | 9/1993  | Friend et al. |      |
| 5,869,929 | A | * | 2/1999  | Eida et al. | 313/501 |
| 6,259,204 | B1|   | 7/2001  | Ebisawa et al. |     |
| 6,551,440 | B2|   | 4/2003  | Tanaka     |         |
| 6,559,594 | B2| * | 5/2003  | Fukunaga et al. | 313/506 |
| 6,821,828 | B2|   | 11/2004 | Ichijo et al. |      |
| 2001/0013756 | A1 | * | 8/2001 | Mori et al. | 313/512 |
| 2002/0005696 | A1 | * | 1/2002 | Yamazaki et al. | 313/503 |
| 2003/0062518 | A1 | * | 4/2003 | Auch et al. | 257/40 |
| 2004/0027066 | A1 | * | 2/2004 | Park et al. | 313/512 |
| 2004/0027327 | A1 |   | 2/2004 | LeCain et al. |     |
| 2007/0013291 | A1 | * | 1/2007 | Cok et al. | 313/501 |
| 2007/0075329 | A1 | * | 4/2007 | Kim | 257/103 |

OTHER PUBLICATIONS

"Organic Electroluminescent Diodes"; of C. W. Tang et al; Applied Physics Letter; vol. 51; No. 12; Sep. 21, 1987; pp. 913-915.
"Electroluminescence Of Doped Organic Thin Films"; of C. W. Tang et al; Journal of Applied Physics; vol. 65; No. 9; May 1, 1989; pp. 3610-3616.

* cited by examiner

Primary Examiner—Peter Macchiarolo
(74) Attorney, Agent, or Firm—Andrew J. Anderson; Stephen H. Shaw; Raymond L. Owens

(57) ABSTRACT

An organic light-emitting diode (OLED) device, comprising: a substrate; one or more OLEDs formed on the substrate comprising a first electrode formed over the substrate, one or more layers of organic material, one of which is light emitting, formed over the first electrode, and a second electrode formed over the one or more layers of organic material; a cover provided over the one or more OLEDs and spaced apart from the one or more OLEDs to form a gap; and separately pre-formed elastic compressible spacer elements located in the gap between the cover and the one or more OLEDs.

18 Claims, 5 Drawing Sheets

OLED DEVICE HAVING SPACERS

FIELD OF THE INVENTION

The present invention relates to organic light-emitting diode (OLED) devices, and more particularly, to OLED device structures for improving light output, improving robustness, and reducing manufacturing costs.

BACKGROUND OF THE INVENTION

Organic light-emitting diodes (OLEDs) are a promising technology for flat-panel displays and area illumination lamps. The technology relies upon thin-film layers of materials coated upon a substrate and employing a cover affixed to the substrate around the periphery of the OLED device. The thin-film layers of materials can include, for example, organic materials, electrodes, conductors, and silicon electronic components as are known and taught in the OLED art. The cover includes a cavity to avoid contacting the cover to the thin-film layers of materials when the cover is affixed to the substrate.

OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic electroluminescent (EL) element, and a cathode. The organic EL element disposed between the anode and the cathode commonly includes an organic hole-transporting layer (HTL), an emissive layer (EML) and an organic electron-transporting layer (ETL). Holes and electrons recombine and emit light in the EML layer. Tang et al. (Appl. Phys. Lett., 51, 913 (1987), Journal of Applied Physics, 65, 3610 (1989), and U.S. Pat. No. 4,769, 292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes be recombined and result in the emission of light, etc. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer. Light generated from the device is emitted through the top transparent electrode. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

Referring to FIG. 2, an OLED device as taught in the prior art includes a substrate 10 on which are formed thin-film electronic components 20, for example conductors, thin-film transistors, and capacitors in an active-matrix device or conductors in a passive-matrix device. The thin-film electronic components 20 can cover a portion of the substrate 10 or the entire substrate 10, depending on the OLED device design. Over the substrate 10 are formed one or more first electrode(s) 14. One or more layers of organic materials 16 are formed over the first electrode(s) 14, at least one layer of which is light emitting. One or more second electrode(s) 18 are formed over the layers of organic materials 16. A cover 12 with a cavity forming a gap 32 to avoid contacting the thin-film layers 14, 16, 18 is affixed to the substrate 10. In some designs, it is proposed to fill the gap 32 with a curable polymer or resin material to provide additional rigidity. The second electrode(s) 18 may be continuous over the surface of the OLED. Upon the application of a voltage across the first and second electrodes 14 and 18 provided by the thin-film electronic components 20, a current can flow through the organic material layers 16 to cause one of the organic layers to emit light 50a through the cover 12 (if it, any material in the gap 32, and the second electrode 18 are transparent) or to emit light 50b through the substrate 10 (if it and the first electrode 14 are transparent). If light is emitted through the substrate 10 it is a bottom-emitter OLED and the thin-film electronic components 20 may occlude some of the light 50b emitted or may limit the emission area to the area 26 between the thin-film electronic components 20, thereby reducing the aperture ratio of the OLED device. If light is emitted through the cover 12 the OLED device is a top-emitter and the thin-film electronic components 20 do not necessarily occlude the emitted light. The arrangement used in FIG. 2 is typically a bottom emitter configuration with a thick, highly conductive, reflective electrode 18 and suffers from a reduced aperture ratio. Referring to FIG. 3, a top-emitter configuration can locate a first electrode 14 partially over the thin-film electronic components 20 thereby increasing the amount of light-emitting area 26. Since, in this top-emitter case, the first electrode 14 does not transmit light, it can be thick, opaque, and highly conductive. However, the second electrode must then be transparent.

In commercial practice, the substrate and cover have comprised 0.7 mm thick glass, for example as employed in the Eastman Kodak Company LS633 digital camera. For relatively small devices, for example less than five inches in diagonal, the use of a cavity in a cover 12 is an effective means of providing relatively rigid protection to the thin-film layers of materials 16. However, for very large devices, the substrate 10 or cover 12, even when composed of rigid materials like glass and employing materials in the gap 32, can bend slightly and cause the inside of the cover 12 or gap materials to contact or press upon the thin-film layers of materials 16, possibly damaging them and reducing the utility of the OLED device.

It is known to employ spacer elements to separate thin sheets of materials. For example, U.S. Pat. No. 6,259,204 B1 entitled "Organic electroluminescent device" describes the use of spacers to control the height of a sealing sheet above a substrate. Such an application does not, however, provide protection to thin-film layers of materials in an OLED device. US20040027327 A1 entitled "Components and methods for use in electro-optic displays" published 20040212 describes the use of spacer beads introduced between a backplane and a front plane laminate to prevent extrusion of a sealing material when laminating the backplane to the front plane of a flexible display. However, in this design, any thin-film layers of materials are not protected when the cover is stressed. Moreover, the sealing material will reduce the transparency of the device and requires additional manufacturing steps.

U.S. Pat. No. 6,821,828 B2 entitled "Method of manufacturing a semiconductor device" granted 20041123 describes an organic resin film such as an acrylic resin film patterned to form columnar spacers in desired positions in order to keep two substrates apart. The gap between the substrates is filled with liquid crystal materials. The columnar spacers may be replaced by spherical spacers sprayed onto the entire surface of the substrate. Similarly, U.S. Pat. No. 6,559,594 entitled "Light Emitting Device" describes the use of a resin spacer formed on the inside of the cover of an EL device. However, such a resin spacer may de-gas and requires expensive photolithographic processing and may interfere with the employment of color filters. Moreover, columnar spacers are formed lithographically and require complex processing steps and expensive materials. Moreover, this design is applied to liquid crystal devices and does not provide protection to thin-film structures deposited on a substrate. Additionally, rigid non-compressible spacers will transfer applied pressure directly to underlying layers, potentially damaging them.

U.S. Pat. No. 6,551,440 B2 entitled "Method of manufacturing color electroluminescent display apparatus and method of bonding light-transmitting substrates" granted 20030422. In this invention, a spacer of a predetermined grain diameter is interposed between substrates to maintain a predetermined distance between the substrates. When a sealing resin deposited between the substrates spreads, surface tension draws the substrates together. The substrates are prevented from being in absolute contact by interposing the spacer between the substrates, so that the resin can smoothly be spread between the substrates. This design does not provide protection to thin-film structures deposited on a substrate The use of cured resins is also optically problematic for top-emitting OLED devices. As is well known, a significant portion of the light emitted by an OLED may be trapped in the OLED layers, substrate, or cover. By filling the gap with a resin or polymer material, this problem may be exacerbated.

There is a need therefore for an improved OLED device structure that improves the robustness and performance of the device and reduces manufacturing costs.

SUMMARY OF THE INVENTION

In accordance with one embodiment, the invention is directed towards an organic light-emitting diode (OLED) device, comprising: a substrate; one or more OLEDs formed on the substrate comprising a first electrode formed over the substrate, one or more layers of organic material, one of which is light emitting, formed over the first electrode, and a second electrode formed over the one or more layers of organic material; a cover provided over the one or more OLEDs and spaced apart from the one or more OLEDs to form a gap; and separately pre-formed elastic compressible spacer elements located in the gap between the cover and the one or more OLEDs.

ADVANTAGES

The present invention has the advantage that it improves the robustness and performance of an OLED device and reduces manufacturing costs.

It will be understood that the figures are not to scale since the individual layers are too thin and the thickness differences of various layers too great to permit depiction to scale.

DETAILED DESCRIPTION OF THE INVENTION

Figure 1:
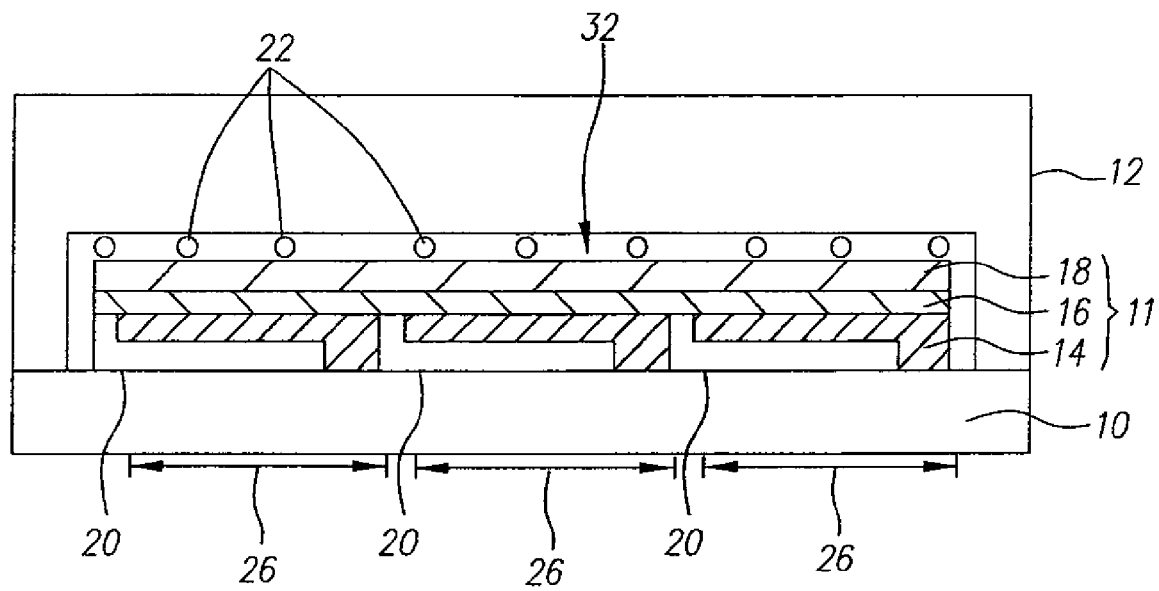
FIG. 1 is a cross section of a top-emitter OLED device having spacer elements according to one embodiment of the present invention.
Figure 2:
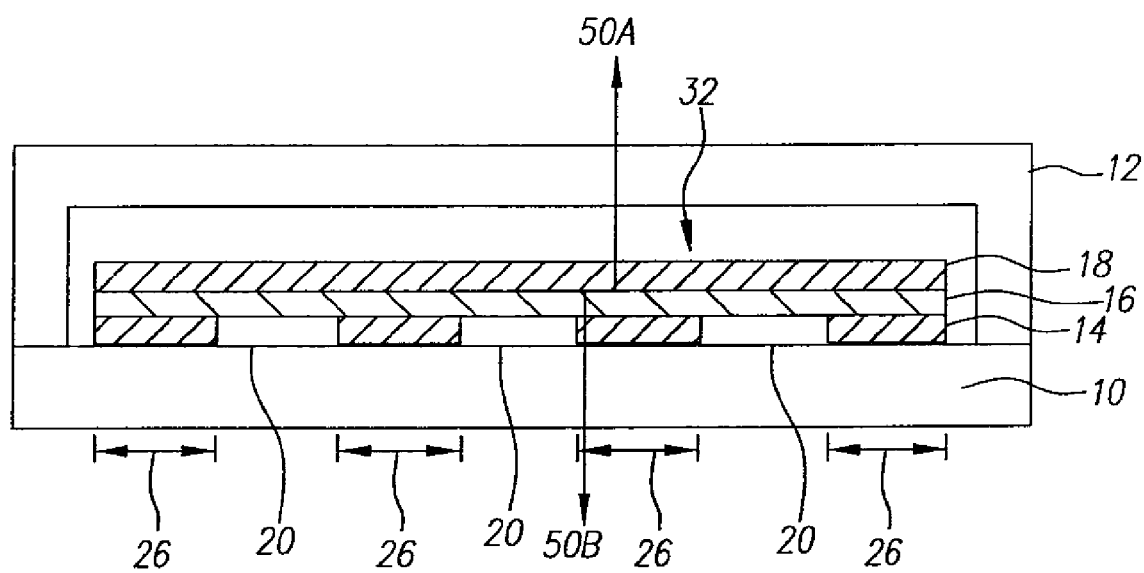
FIG. 2 is a cross section of a prior-art OLED device.
Figure 3:
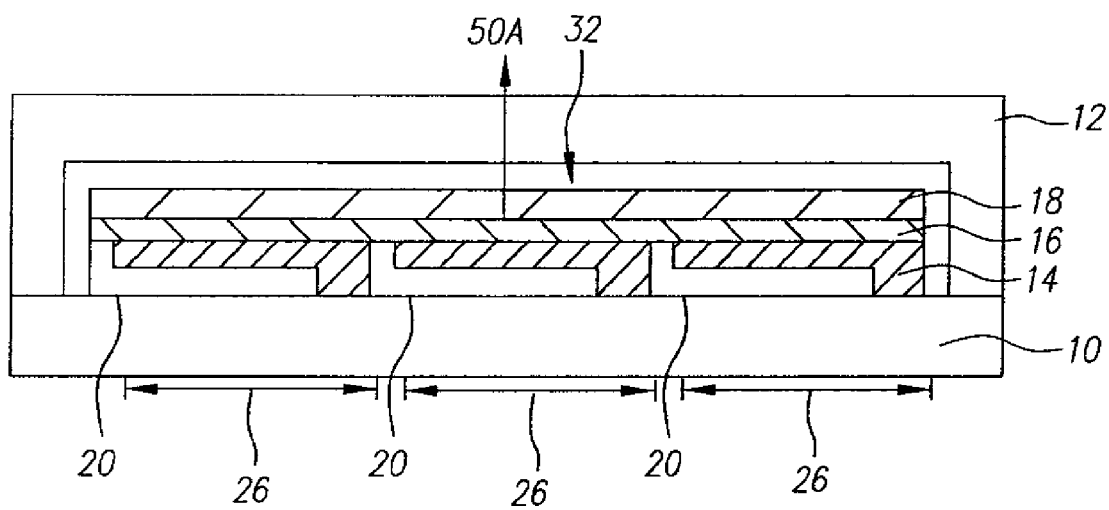
FIG. 3 is a cross section of an alternative prior-art OLED device.

Referring to FIG. 1, in accordance with the present invention an organic light-emitting diode (OLED) device comprises a substrate 10; an OLED 11 formed over the substrate 10 comprising a first electrode 14 formed over the substrate, one or more layers of organic material 16, one of which is light emitting, formed over the first electrode 14, and a second electrode 18 formed over the one or more layers of organic material 16; a cover 12 provided over the one or more OLEDs 11 and spaced apart from the one or more OLEDs 11 to form a gap 32; and separately pre-formed elastic compressible spacer elements 22 located in the gap between the cover 12 and the one or more OLEDs 11. An organic light-emitting diode (OLED) device, comprising:

According to the present invention, the elastic compressible spacer elements 22 are non-integral with the cover 12 or substrate 10 and are separately pre-formed before they are applied between the cover 12 and the OLED 11 in the gap 32: that is, the elastic compressible spacer elements 22 are not formed, for example, by lithographic materials processes used to make the OLED material 11, electrodes 14 and 18, or thin-film silicon materials as are found in active-matrix display devices of the prior art. In particular, the elastic compressible spacer elements 22 are not lithographically formed from materials used to construct or process layers on the substrate 10, for example thin-film electronic components, passivation layers, and electrodes made of various forms of silicon (LTPS, amorphous), silicon dioxide or silicon nitride, and metals or metal oxides, or metal alloys. As employed in the present invention, the elastic compressible spacer elements 22 are separately pre-formed and located in the gap 32 after the cover 12 is formed and the OLED 11 is formed on the substrate 10. The elastic compressible spacer elements 22 are particles of material, not continuous films, used to either absorb mechanical stress applied between the cover 12 and the substrate 10 or to redirect the applied stress to areas of the OLED device that are not as sensitive or easily damaged. The elastic compressible spacer elements 22 are not continuous films but may be deposited in a single layer.

The present invention may be employed together with a scattering layer located between the cover 12 and substrate 10 to scatter light that would otherwise be trapped in the OLED device, in conjunction with a transparent low-index element having a refractive index lower than that of the OLED and of the encapsulating cover, as taught in co-pending, commonly assigned U.S. Ser. No. 11/065,082 filed Feb. 24, 2005, the disclosure of which is hereby incorporated in its entirety by reference. Materials of a light scattering layer can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. In order to effectively space the OLED 11 from the cover 12 and provide a useful optical structure when employing a scattering layer as discussed in such co-pending application, the spacer elements 22 preferably have a thickness of one micron or more but preferably less than one millimeter.

Figure 5:
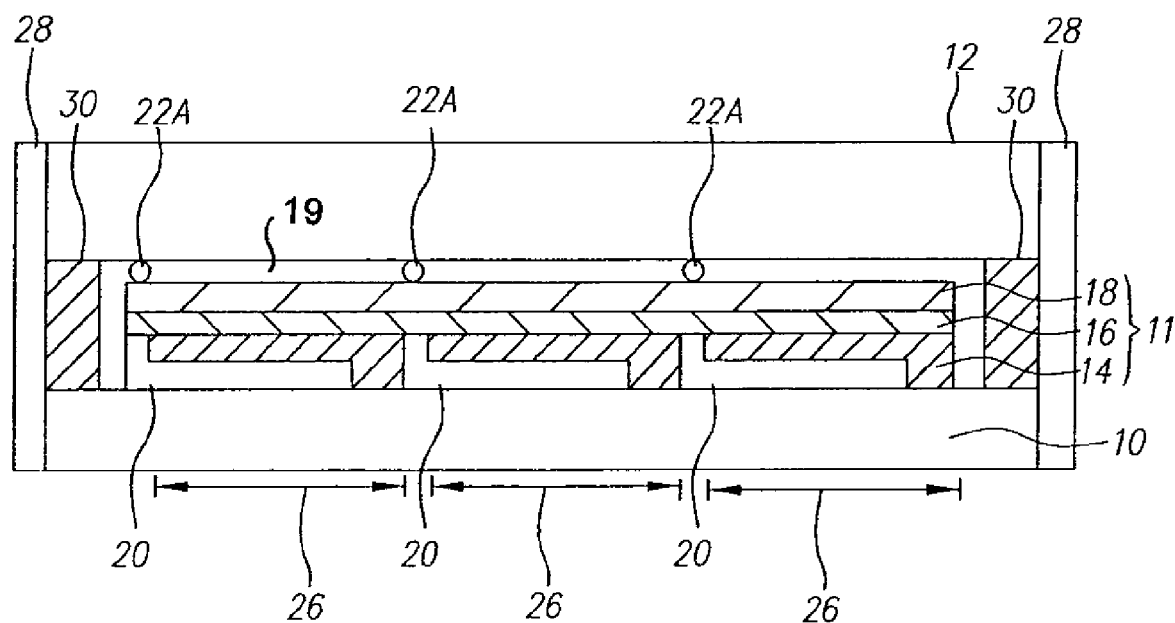
FIG. 5 is a cross section of a top-emitter OLED device having spacer elements and an end cap according to yet another embodiment of the present invention.

The elastic compressible spacer elements 22 may be formed, for example, from a variety of polymers, may take a variety of shapes, for example spheres, cylinders, or have a random shape, but it is understood that the shapes are not limited thereto. Spherical shapes may have advantages in deposition, while cylinders may have optical advantages and random shapes may provide useful optical diffusion. In order to be able to absorb or redirect any stress applied to the substrate 10 and/or cover 12, the elastic compressible spacer elements 22 are more compressible than each of the substrate and cover, and less compressible than other material located in the gap 32. Subject to the requirement that they be elastic compressible, the spacer elements 22 may additionally comprise pigments or dyes, including carbon, carbon black, pigmented inks, or dyes. The spacer elements 22 may be black or form a black matrix. Additionally, the spacer elements 22 may further comprise a desiccant. The gap 32 may be filled with a low-index material 19 (as shown in FIG. 5) having a refractive index lower than that of the OLED and of the encapsulating cover, including, e.g., an inert gas, air, nitrogen, or argon.

The elastic compressible spacer elements 22 may be applied to either the cover 12 or the OLED 11 after the OLED 11 is formed on the substrate 10 and before the cover is located over the OLED 11. Once the cover 12 is formed and the OLED 11 with all of its layers deposited on the substrate 10, together with any other components 20, the elastic compressible spacer elements 22 may be deposited on the OLED 11 and the cover 12 brought into alignment with the OLED 11. Alternatively, the elastic compressible spacer elements 22 may be distributed over the inside of the cover 12 and then the elastic compressible spacer elements 22 and the cover 12 brought into alignment with the OLED 11 and substrate 10.

The elastic compressible spacer elements 22 may be located over the OLED 11 or cover 12 in a variety of ways. The spacer elements themselves may have an adhesive coating 24 and they may be sprayed over the surface of the OLED 11 or cover 12. Alternatively, an adhesive 24 may be coated on the OLED 11 or cover 12 and the elastic compressible spacer elements 22 sprayed or otherwise deposited over the adhesive coating 24. In such a process, the elastic compressible spacer elements 22 are typically deposited either in a regular pattern or randomly over the coated surface but a large-scale uniform distribution of spacer elements is preferred. In this case, the elastic compressible spacer elements 22 are preferably as transparent as possible to avoid absorbing any emitted light.

Figures 7A, 7B:
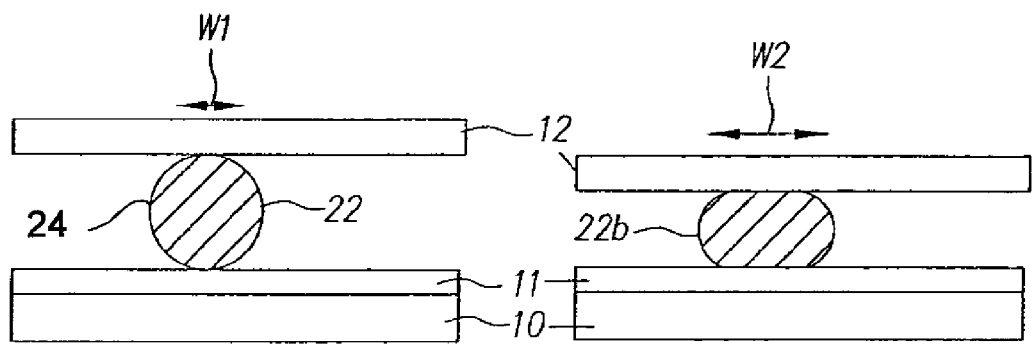
FIGS. 7a and 7b are partial cross-sections of an OLED device having compressed or uncompressed spacer elements according to an embodiment of the present invention.

According to the present invention, an elastic compressible spacer dot may change its shape when compressed, thereby increasing the contact area with the compressing surface. When the stress is removed, the elastic compressible spacer element 22 returns to its former shape. According to the present invention, the spacer element may not completely return to its former shape, but does so substantially so that repeated stress may cause compression until the elastic compressible spacer element 22 fails. Referring to FIG. 7a, an elastic compressible spacer element 22 in an uncompressed state has a contact area W1 with the cover 12 and OLED 11. An adhesive 24 is applied to the elastic compressible spacer element 22 to keep the elastic compressible spacer element 22 stationary. As shown in FIG. 7b, an elastic compressible spacer element 22 in a compressed state has a contact area W2 with the cover 12 and OLED 11. Because the compressed state contact area W2 is larger than the uncompressed state contact area W1, the pressure on the OLED 11 and cover 12 is smaller and the potential damage done to the OLED 11 is reduced. If a spacer element is not elastic compressible, the spacer element would not change shape due to stress and the pressure applied to the OLED 11 would be larger and more likely to cause damage. An adhesive 24 is applied to the elastic compressible spacer element 22 to keep the elastic compressible spacer element 22 stationary.

Figure 4:
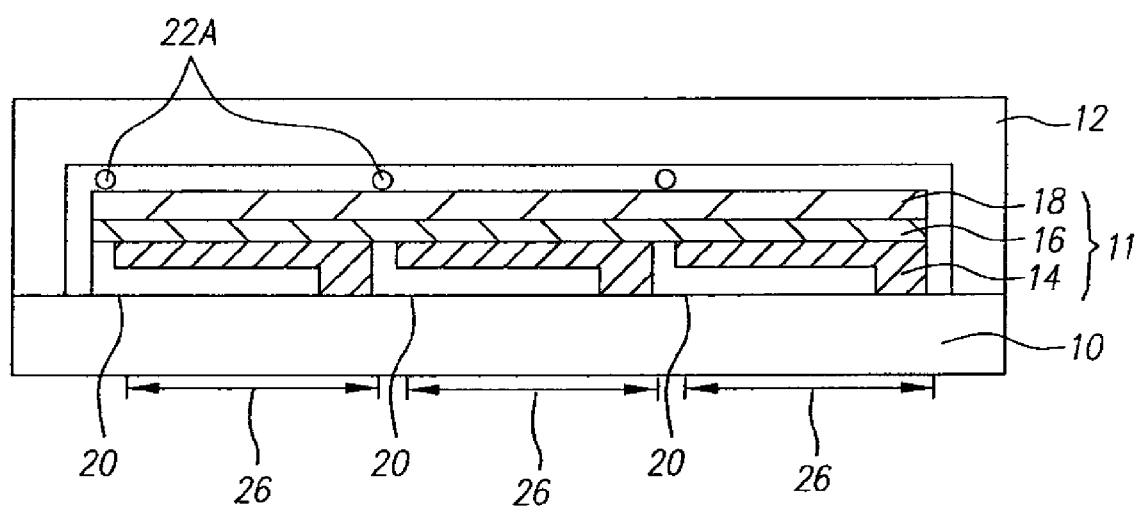
FIG. 4 is a cross section of a top-emitter OLED device having spacer elements according to an alternative embodiment of the present invention.
Figure 6:
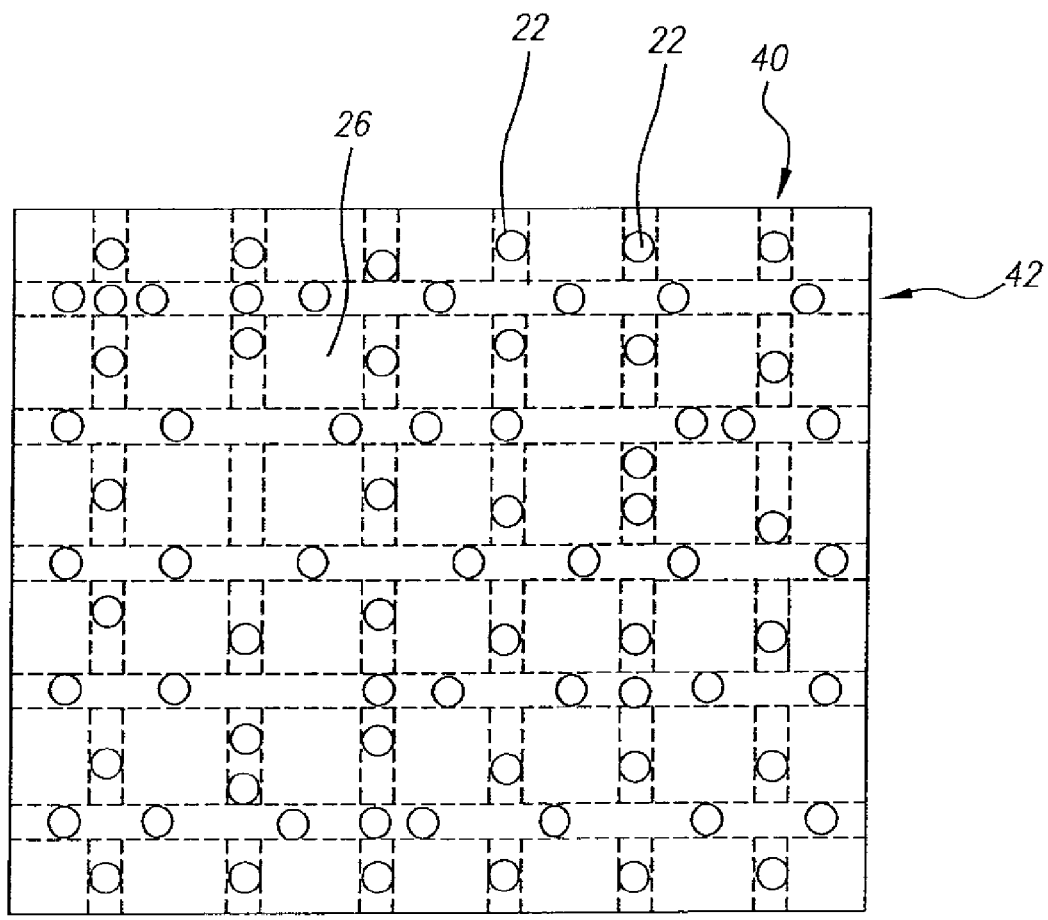
FIG. 6 is a top view of an OLED device having spacer elements distributed between light-emitting areas according to another embodiment of the present invention.

Referring to FIG. 4, in an alternative embodiment of the present invention, an adhesive may be patterned over the surface of the OLED 11 or cover 12 between light-emitting areas 26 of the OLED device. In this embodiment, the subsequently adhered elastic compressible spacer elements will also be located between the light emitting areas 26 of the OLED device so that any light emitted by the OLED 11 will not encounter the elastic compressible spacer elements and thereby experience any undesired optical effect. In this case, the illustrated elastic compressible spacer elements 22a may be black and light absorbing, since no light is emitted from the areas in which the spacer elements are deposited and a black spacer element can then absorb stray or ambient light, thereby increasing the sharpness and ambient contrast of the OLED device. The elastic compressible spacer elements 22 may be located either around every light emitting area or in areas between some of the light-emitting areas, for example in rows or columns between pixel groups as is shown in FIG. 6.

In a preferred embodiment, the spacer elements are located around the periphery of any light-emitting areas. In these locations, any pressure applied by the deformation of the cover 12 or substrate 10 is transmitted to the elastic compressible spacer elements 22 at the periphery of the light-emitting areas, thereby reducing the stress on the light-emitting materials. Although light-emitting materials may be coated over the entire OLED device, stressing or damaging them between the light-emitting areas (without creating an electrical short) may not have a deleterious effect on the OLED device. If, for example, the top electrode 18 is damaged, there may not be any significant damage to the device nor any change in light emission from the light-emitting areas. Moreover, in a top-emitter configuration, the periphery of the OLED light-emitting areas 26 may be taken up by thin-film silicon materials that are more resistant to stress.

In one embodiment of the invention, the elastic compressible spacer elements 22 may be hemisphere-shaped. A hemisphere provides a precision gap as well as high light transmission. A hemisphere also provides excellent compression and fatigue characteristics. In another embodiment of the invention, the elastic compressible spacer elements 22 may be cylinder-shaped having rectangular or circular cross sections. A rectangular elastic compressible spacer element 22 (for example a cube) provides impact resistance as well as a precision optical spacing. In another embodiment, the elastic compressible spacer elements 22 may be pyramid-shaped, which may have a flat top. A pyramid provides a precision optical gap as well as some light directing. A 45-degree pyramid in air will tend to focus transmitted light into a line perpendicular to the base of the pyramid providing both optical spacing as well as light directing. Further, the pyramid and hemisphere shapes provide a more rapidly changing compression gradient as the shape is compressed.

Materials of elastic compressible spacer elements 22 can include organic materials (for example polymers or electrically conductive polymers) or inorganic materials. The elastic compressible spacer elements 22 are preferably constructed from a polymer. A transparent polymeric material may provide high light transmission properties, is inexpensive and may easily be formed into elastic compressible spacer elements 22. Suitable polymer materials include polyolefins, polyesters, polyamides, polycarbonates, cellulosic esters, polystyrene, polyvinyl resins, polysulfonamides, polyethers, polyimides, polyvinylidene fluoride, polyurethanes, polyphenylenesulfides, polytetrafluoroethylene, polyacetals, polysulfonates, polyester ionomers, and polyolefin ionomers. Polycarbonate polymers have high light transmission and strength properties. Copolymers and/or mixtures of these polymers can be used. Polyolefins particularly polypropylene, polyethylene, polymethylpentene, and mixtures thereof are suitable. Polyolefin copolymers, including copolymers of propylene and ethylene such as hexene, butene and octene can also be used. Polyolefin polymers are suitable because they are low in cost and have good strength and surface properties and have been shown to be soft and scratch resistant.

When located in light-emitting areas 26, the polymeric materials used to make the elastic compressible spacer elements 22 of this invention preferably have a light transmission greater than 92%. A polymeric material having an elastic modulus greater than 500 MPa is suitable. An elastic modulus greater than 500 MPa allows the elastic compressible spacer elements 22 to withstand the compressive forces to which display screens may be subject. Further, an elastic modulus greater than 500 MPa allows for efficient assembly of a display as the elastic compressible spacer elements 22 are tough and scratch resistant.

If deposited over the light-emitting areas, the elastic compressible spacer elements 22 may also serve as light scattering elements and employed to enhance light output as taught in co-pending, commonly assigned U.S. Ser. No. 11/065,082 filed Feb. 24, 2005. Such light scattering may have advantages in extracting light from the OLED by reducing the amount of light that is waveguided in the organic layers 16 and electrodes 18 and 14, if they are partially transparent. To enhance the scattering and light extraction effect, the elastic compressible spacer elements 22 may have a refractive index greater than the refractive index of any component of the OLED and/or any materials in the gap 32 have a refractive index lower than the refractive index of any component of the OLED. The spacer elements may be sprayed on or deposited using inkjet techniques. Various coating techniques, for example, spin or curtain coating, may also be employed.

Figure 8A:
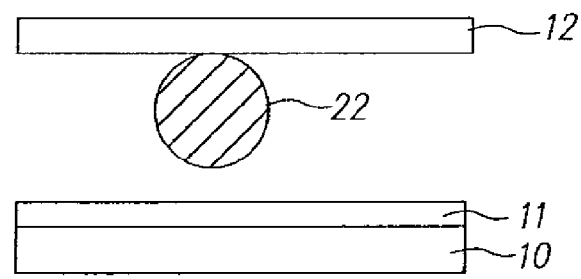
FIGS. 8a, 8b, and 8c are partial cross-sections of an OLED device having spacer elements located in different positions according to various embodiments of the present invention.
Figure 8B:
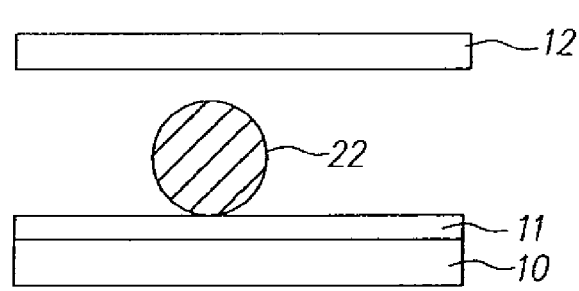
Figure 8C:
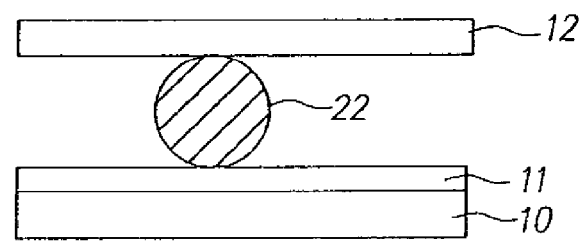

The cover 12 may or may not have a cavity. If the cover 12 does have a cavity, the cavity may be deep enough to contain the elastic compressible spacer elements 22 so that the periphery of the cover 12 may be affixed to the substrate 10, as shown in FIG. 1. The elastic compressible spacer elements 22 may be in contact with only the inside of the cover 12 (if applied to the cover) as shown in FIG. 8a, or be in contact with only the OLED 11 (if applied to the OLED) as shown in FIG. 8b, or to both the OLED 11 and the inside of the cover 12 as shown in FIG. 8c. If the elastic compressible spacer elements 22 are in contact with both the OLED 11 and the inside of the cover 12 and the cover 12 is affixed to the substrate 10, the cavity in the cover 12 should have a depth approximately equal to the thickness of the spacer elements 22. Alternatively, referring to FIG. 5, the cover may not have a cavity. In this case, a sealant 30 should be employed to defeat the ingress of moisture into the OLED device. An additional end-cap 28 may be affixed to the edges of the cover 12 and substrate 10 to further defeat the ingress of moisture or other environmental contaminants into the OLED device. To enhance the scattering and light extraction effect, the elastic compressible spacer elements 22a may have a refractive index greater than the refractive index of any low-index material 19 utilized by the OLED.

Figure 9:
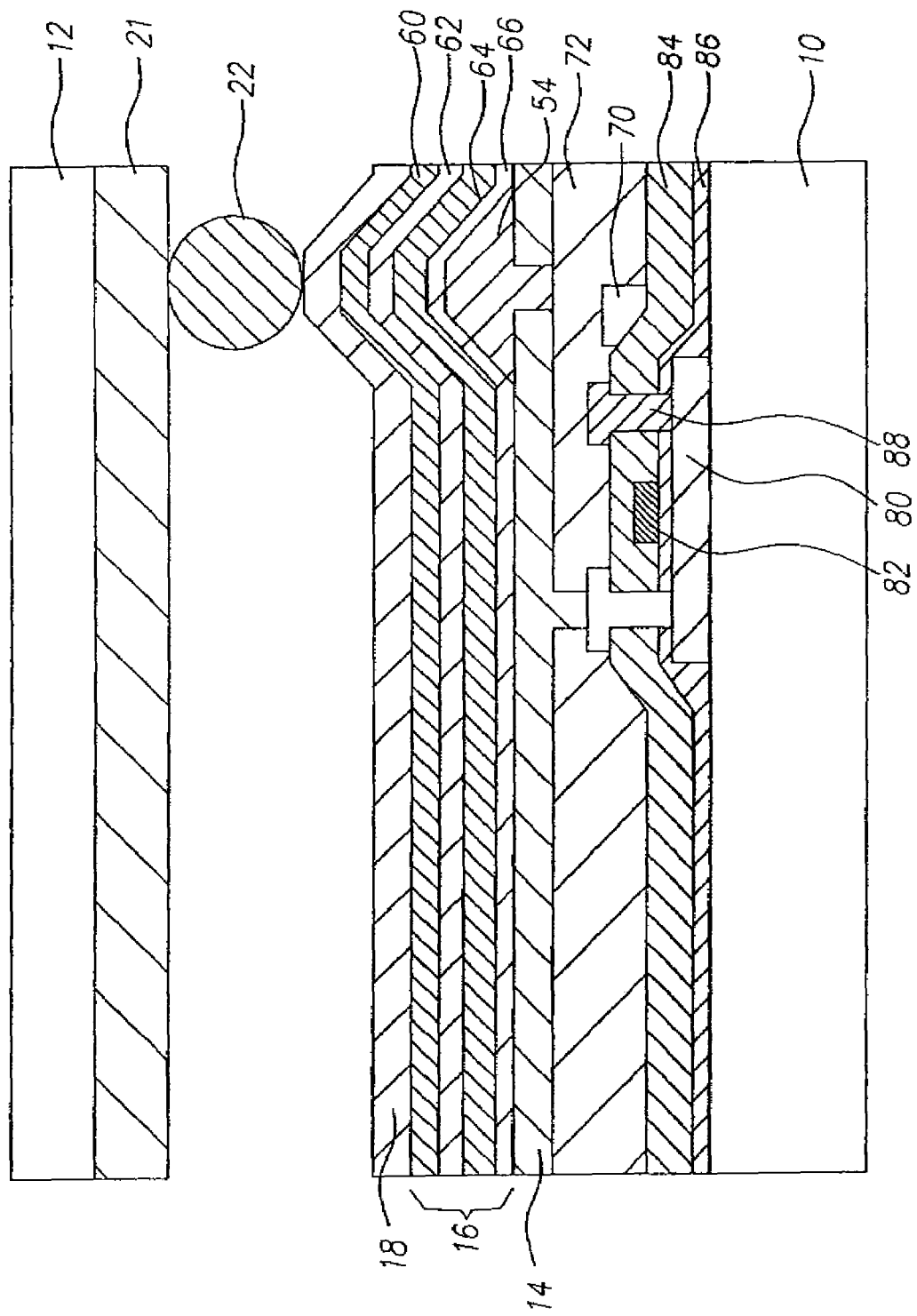
FIG. 9 is a partial cross section of a top-emitter OLED device having spacer elements and color filters according to another embodiment of the present invention.

Referring to FIG. 9, a more detailed cross-section of one light emitting element of an OLED device having active-matrix driving circuitry according to an embodiment of the present invention is shown. Over the substrate 10, a semiconducting layer 80 is formed and patterned. Preferred materials for the semiconducting layer include polysilicon. A gate-insulating layer 86 is formed over the semiconductor layer. Over the gate-insulating layer, a gate conductor layer 82 is formed. Typical materials used to form the gate-insulating layer 86 are silicon dioxide or silicon nitride. The semiconductor layer 80 is then doped to form source and drain regions on either sides of the gate (not shown). A first interlayer insulator layer 84 is formed over the gate conductor layer 82. Typical materials used to form the first interlayer insulator layer 84 are silicon dioxide or silicon nitride. Over the first interlayer insulator layer 84, a second conductor layer is deposited and patterned forming the power lines 88 and the data lines 70.

A second interlayer insulator layer 72 is formed over the second conductor layers. The second interlayer insulator layer 72 preferably is leveled or of a planarizing type material which smooth the device topography. These portions of the semiconductor layer and gate conductor together function as a thin-film transistor.

This thin-film transistor as well as the power and data lines make up a portion of the active-matrix circuitry. Additional active-matrix circuitry components such as select lines, additional transistors, and capacitors which are not shown may also be employed to drive the OLED as is known in the art. Over the second interlayer insulator layer 72, the first electrode 14 is formed. Each first electrode is patterned so as to be isolated from other first electrodes of other neighboring OLEDs. For a top-emitting device, the first electrode 14 is typically formed of a material which is both conductive and reflective, such as for example, aluminum (Al), silver (Ag), or molybdenum (Mo), gold (Au), or platinum (Pt). Around the edges of the first electrodes, an inter-pixel insulating film 54 is formed to reduce shorts between the electrodes 14 and 18. Use of such insulating films over the first electrode is disclosed in U.S. Pat. No. 6,246,179. While use of an inter-pixel insulating film is preferred, it is not required for successful implementation of the invention.

Over the first electrode, the organic EL layers 16 are deposited. There are numerous organic EL layer structures known in the art wherein the present invention can be employed. A common configuration of the organic EL layers is employed in the preferred embodiment consisting of a hole-injecting layer 66, a hole-transporting layer 64, an emitting layer 62, and an electron-transporting layer 60. Disposed over the organic EL layers is the second electrode 18. In a top-emitter configuration the second electrode 18 should be transparent and conductive. Preferred materials used for the second electrode 18 include indium tin oxide (ITO), indium zinc oxide (IZO), or a thin metal layer such as Al, Mg, or Ag which is preferably between 5 nm and 25 nm in thickness. While one layer is shown for the second electrode, multiple sub-layers can be combined to achieve the desired level of conductance and transparency such as an ITO layer and an Al layer. The second electrode may be common to all pixels and does not necessarily require precision alignment and patterning.

Elastic compressible spacer element 22 is disposed above the second electrode 18 between active emitting areas of the pixels as shown. Elastic compressible spacer element 22 is used to space cover 12 from the OLED 11. As noted above, the spacer element may be deposited on either the cover or above the second electrode 18. When these elements are deposited on the second electrode 18, it is desirable that a thin film protection layer (not shown), such as a layer of aluminum oxide, be first formed directly on the second electrode 18.

As further illustrated in FIG. 9, the present invention may also incorporate color filters 21 disposed between the cover 12 and the second electrode 18. Such color filters may be located on the inside of the cover and may be deposited, for example by screen printing, on the OLED 11 or protective layers described above (for example on the electrode 18 or on any protective or optical layers formed on the electrode 18) or on the inside of the cover 12 to form locally colored areas that filter the light emitted from the OLEDs. In one embodiment, each OLED may include one or more light emitting layers arranged to produce broad-band light emission, and an array of two or more different colored color filter elements may be located in the gap 32 to filter the light, wherein each of the differently colored color filter elements filters the broad-band light to transmit a different colored light, e.g., so as to form full-color pixels. The elastic compressible spacer elements 22 may be in contact, as shown in FIG. 9, with the color filters 21.

According to the present invention, an OLED device employing elastic compressible spacer elements 22 located in a gap between a cover 12 and an OLED 11 is more robust in the presence of stress between the cover 12 and the substrate 10. In a typical situation, the cover 12 is deformed either by bending the entire OLED device or by separately deforming the cover or substrate, for example by pushing on the cover or substrate with a finger or hand or by striking the cover or substrate with an implement such as a ball. When this occurs, the substrate or cover will deform slightly putting pressure on the elastic compressible spacer elements. Since the elastic compressible spacer elements are more compressible than each of the substrate and cover and less compressible than other material within the gap 32, the elastic compressible spacer elements will preferably absorb the pressure, preventing the cover 12 or other material within the gap from pressing upon the OLED 11.

One or more additional protective layers may be applied to the top electrode 18 to provide environmental and mechanical protection. For example, a layer of ITO, parylene, or a plurality of layers of $Al_2O_3$ may be coated over the electrode 18 to provide a hermetic seal and may also provide useful optical properties to the electrode 18.

The elastic compressible spacer elements 22 may have a thickness of between 10 nm and 100 microns, more preferably between 100 nm and 10 microns. It is not essential that all of the spacer elements have the same shape or size.

Most OLED devices are sensitive to moisture or oxygen, or both, so they are commonly sealed in an inert atmosphere such as nitrogen or argon, along with a moisture-absorbing desiccant such as alumina, bauxite, calcium sulfate, clays, silica gel, zeolites, barium oxide, alkaline metal oxides, alkaline earth metal oxides, sulfates, or metal halides and perchlorates. The spacer elements may have desiccating properties and may include one or more of the desiccant materials. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

In order to maintain a robust and tight seal around the periphery of the substrate and cover, and to avoid possible motion of the cover 12 with respect to the substrate 10 and possibly damaging the electrodes and organic materials of the OLED, it is possible to adhere the cover to the substrate in an environment that has a pressure of less than one atmosphere. If the gap is filled with a relatively lower-pressure gas (for example air, nitrogen, or argon), this will provide pressure between the cover and substrate to help prevent motion between the cover and substrate, thereby creating a more robust component.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

| PARTS LIST | |
|---|---|
| 10 | substrate |
| 11 | OLED |
| 12 | cover |
| 14, 18 | electrode |
| 16 | organic layers |
| 19 | low-index material |
| 20 | thin-film electronic components |
| 21 | color filter |
| 22 | spacer element |
| 22a | light-absorbing spacer element |
| 22b | deformed spacer element |
| 24 | adhesive |
| 26 | light-emitting area |
| 28 | end cap |
| 30 | sealant |
| 32 | gap |
| 40 | columns between light-emitting areas |

-continued

PARTS LIST

| | |
|---|---|
| 42 | rows between light-emitting areas |
| 50a, 50b | light |
| 54 | inter-pixel insulating film |
| 60 | electron-transporting layer |
| 62 | emitting layer |
| 64 | hole-transporting layer |
| 66 | hole-injecting layer |
| 70 | data lines |
| 72 | second interlayer insulator layer |
| 80 | semiconducting layer |
| 82 | gate conductor layer |
| 84 | interlayer insulator layer |
| 86 | gate-insulating layer |
| 88 | power lines |
| W1, W2 | width |

The invention claimed is:

1. An organic light-emitting diode (OLED) device, comprising:
   a substrate;
   a plurality of OLEDs defining light-emitting areas formed on the substrate, each OLED comprising a first electrode formed over the substrate, one or more layers of organic material, one of which is light emitting, formed over the first electrode, and a second electrode formed over the one or more layers of organic material;
   a cover provided over the one or more OLEDs and spaced apart from the one or more OLEDs to form a gap; and
   a plurality of non-integral, pre-formed elastic compressible, ball-shaped spacer elements located in the gap between the cover and the plurality of OLEDs, within the light-emitting area of each OLED.

2. The OLED device of claim 1, comprising a plurality of OLEDs defining spatially separated light-emitting areas, and wherein the elastic compressible spacer elements are located between the spatially separated light-emitting areas.

3. The OLED device of claim 1, wherein the one or more OLEDs further comprise one or more protective, encapsulating, and/or optical layers formed over the second electrode.

4. The OLED device of claim 1, wherein the spacer elements are in contact with the cover or the one or more OLEDs.

5. The OLED device of claim 1, wherein the spacer elements are in contact with the cover and the one or more OLEDs.

6. The OLED device of claim 1, wherein the spacer elements are randomly located.

7. The OLED device of claim 1, wherein the spacer elements are transparent or light absorbing.

8. The OLED device of claim 6, wherein the spacer elements are black.

9. The OLED device of claim 1, wherein the spacer elements are moisture absorbing.

10. The OLED device of claim 1, wherein the spacer elements are light-scattering particles.

11. The OLED device of claim 1, wherein the cover is affixed directly to the substrate.

12. The OLED device of claim 1, further comprising an encapsulating end-cap affixed to both the cover and the substrate.

13. The OLED device of claim 1, wherein the spacer elements are affixed to the cover or OLED with an adhesive.

14. The OLED device of claim 13, wherein the adhesive is patterned.

15. The OLED device of claim 1, wherein the gap is filled with a low-index material having a refractive index lower than that of the OLEDs and of the cover.

16. The OLED device of claim 1, wherein the spacer elements have a cross section greater than 1 micron.

17. The OLED device of claim 1, wherein the spacer elements have a refractive index greater than the refractive index of any component of the OLED.

18. The OLED device of claim 1, wherein the gap is maintained at a pressure of less than one atmosphere.

* * * * *